(12) United States Patent
Choe et al.

(10) Patent No.: US 7,164,289 B1
(45) Date of Patent: Jan. 16, 2007

(54) REAL TIME FEEDBACK COMPENSATION OF PROGRAMMABLE LOGIC MEMORY

(75) Inventors: Kok Heng Choe, Penang (MY); Edwin Yew Fatt Kok, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/905,830

(22) Filed: Jan. 21, 2005

(51) Int. Cl.
*G06F 7/38* (2006.01)
(52) U.S. Cl. .......................................... 326/40; 326/38
(58) Field of Classification Search ................ 326/16, 326/39, 40, 41, 47; 365/211
See application file for complete search history.

(56) References Cited

U.S. PATENT DOCUMENTS 6,081,473 A * 6/2000 Agrawal et al. ....... 365/230.01

* cited by examiner

*Primary Examiner*—Daniel Chang
(74) *Attorney, Agent, or Firm*—Townsend and Townsend and Crew, LLP

(57) ABSTRACT

Memory performance in programmable logic is significantly increased by adjusting circuitry operation to adjust for variations in process, voltage, or temperature. A calibration circuit adjusts control signal timing, dynamically and automatically, to compensate real time to process, voltage, and temperature variation. A feedback system using a control block and a dummy mimicking concept are provided.

12 Claims, 10 Drawing Sheets

Control Signal Timing is Generated using Delay Chain and Controlled by Mux Setting Updating the delay setting from the calibrator circuit

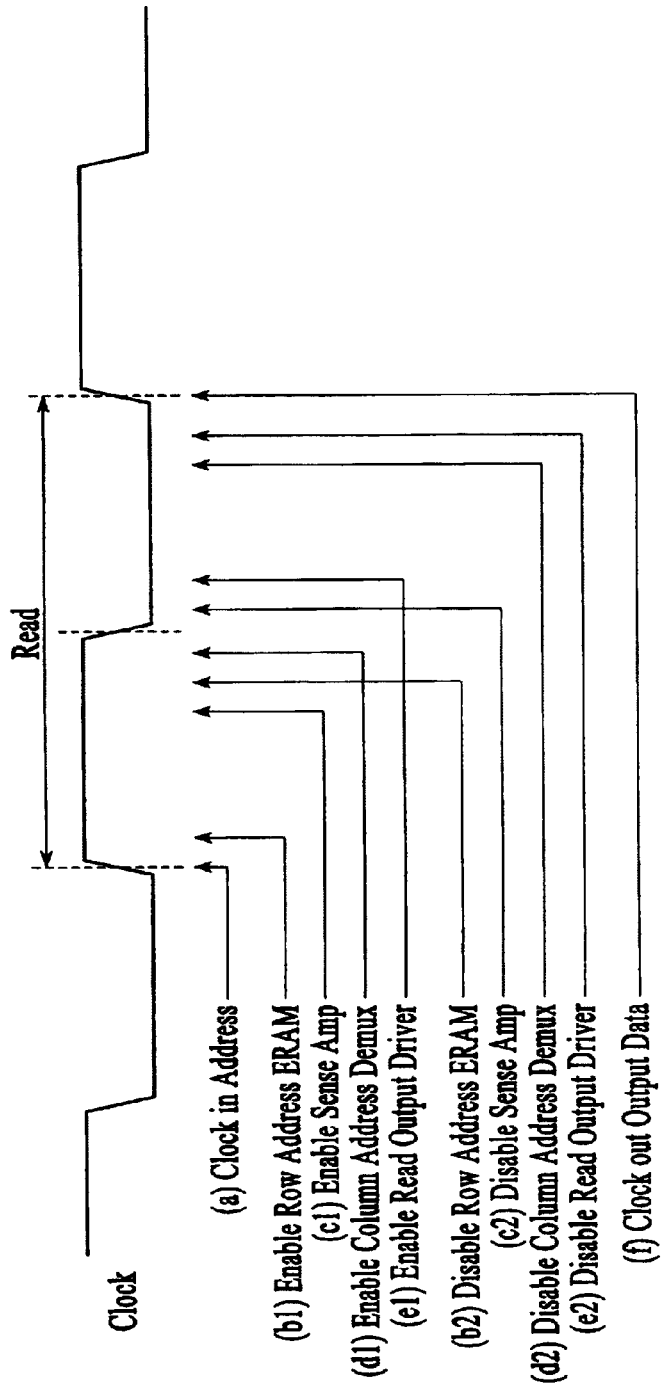

Changing Delay Structure to adopt the Calibration Circuit Implementation

Table 1 - Control block sequence and the data injected into the memory circuitry

| Setting | Cycle | Pattern | Read | Write |
|---|---|---|---|---|
| 1 | 0 | 0 | 1 | 0 |
| | 1 | 1 | 1 | 0 |
| | 2 | 0 | 0 | 1 |
| | 3 | 1 | 0 | 1 |
| *Pass; Change Delay Setting to Tighter Spec; 2$^{nd}$ Setting* | | | | |
| 2 | 4 | 0 | 1 | 0 |
| | 5 | 1 | 1 | 0 |
| | 6 | 0 | 0 | 1 |
| | 7 | 1 | 0 | 1 |
| *Pass; Change Delay Setting to Tighter Spec; 3$^{rd}$ Setting* | | | | |
| 3 | 8 | 0 | 1 | 0 |
| | 9 | 1 | 1 | 0 |
| | 10 | 0 | 0 | 1 |
| | 11 | 1 | 0 | 1 |
| *Pass; Change Delay Setting to Tighter Spec; 4$^{th}$ Setting* | | | | |
| 4 | 12 | 0 | 1 | 0 |
| | 13 | 1 | 1 | 0 |
| | 14 | 0 | 0 | 1 |
| | 15 | 1 | 0 | 1 |
| *Fails; Set Delay to 3$^{rd}$ Setting* ** | | | | |

** *Extra CRAM Bit can provide flexibility to select 1 or more setting prior to failed setting.*

FIG.12

REAL TIME FEEDBACK COMPENSATION OF PROGRAMMABLE LOGIC MEMORY

BACKGROUND OF THE INVENTION

The invention relates generally to the field of integrated circuits and in particular, to programmable logic integrated circuits. More specifically, the invention provides increased bandwidth operation for on-chip memory of a programmable logic integrated circuit.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, look-up tables, and combinations of these. Programmable logic integrated circuits also include embedded user-programmable memory or RAM.

Despite the success of programmable logic, there is a continuing desire to provide higher performance and greater functionality in programmable logic integrated circuits. For example, it is desirable to provide higher performance memory operation in a programmable logic integrated circuit. In other words, more memory operations, such as reading or writing, or both, may be performed in a given time. Faster data storage and retrieval from the programmable logic memory facilitates higher performance electronic systems.

Therefore, there is a need to provide techniques and circuitry to improve the performance of memories in an integrated circuit, especially in programmable logic integrated circuits.

SUMMARY OF THE INVENTION

The invention increases memory performance in programmable logic significantly by adjusting circuitry operation to account for variations in process, voltage, or temperature (PVT), instead of using worst-case scenario timing. A calibration circuit on the integrated circuit adjusts control signal timing, dynamically, automatically, and real time, to compensate to process, voltage, and temperature variation. A feedback system using a control block and a dummy mimicking concept is utilized.

A memory design uses control signals to control both the read and write operation of a memory. In a typical memory design, the timing of these memory control signals are selected to handle even worst case conditions. However, when an integrated circuit is in actual operation by a user, the PVT conditions are often not worst case. In such cases, the timing of the control signals may be tightened up to provide faster memory performance. There can be a significant improvement in performance between worst case conditions and actual operating conditions.

The invention increases programmable logic memory performance to the limits. According to the invention, PVT variation may be tracked in real time without effecting normal memory operation. There is an insignificant die size impact on a programmable logic design. The invention does not require an architectural change to the circuitry. Calibration circuit is relatively simple and may be easily included in a memory architecture.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 9 provides a timing diagram of setting the calibration circuit on or off.

FIG. 10 shows an example of memory internal control signal timing for a read operation.

FIG. 12 provides a table of the operation of a calibration circuit of the invention.

DETAILED DESCRIPTION

Figure 1:
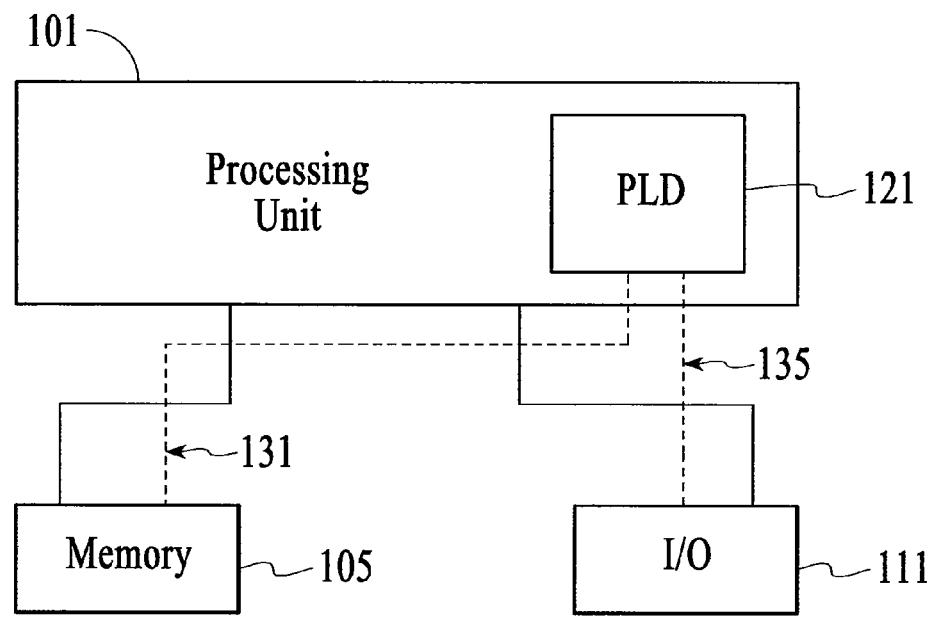
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, Hardcopy™, FLEX®, APEX™, and STRATIX® series of PLDs. These are described in, for example, U.S. Pat. Nos. 4,617, 479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
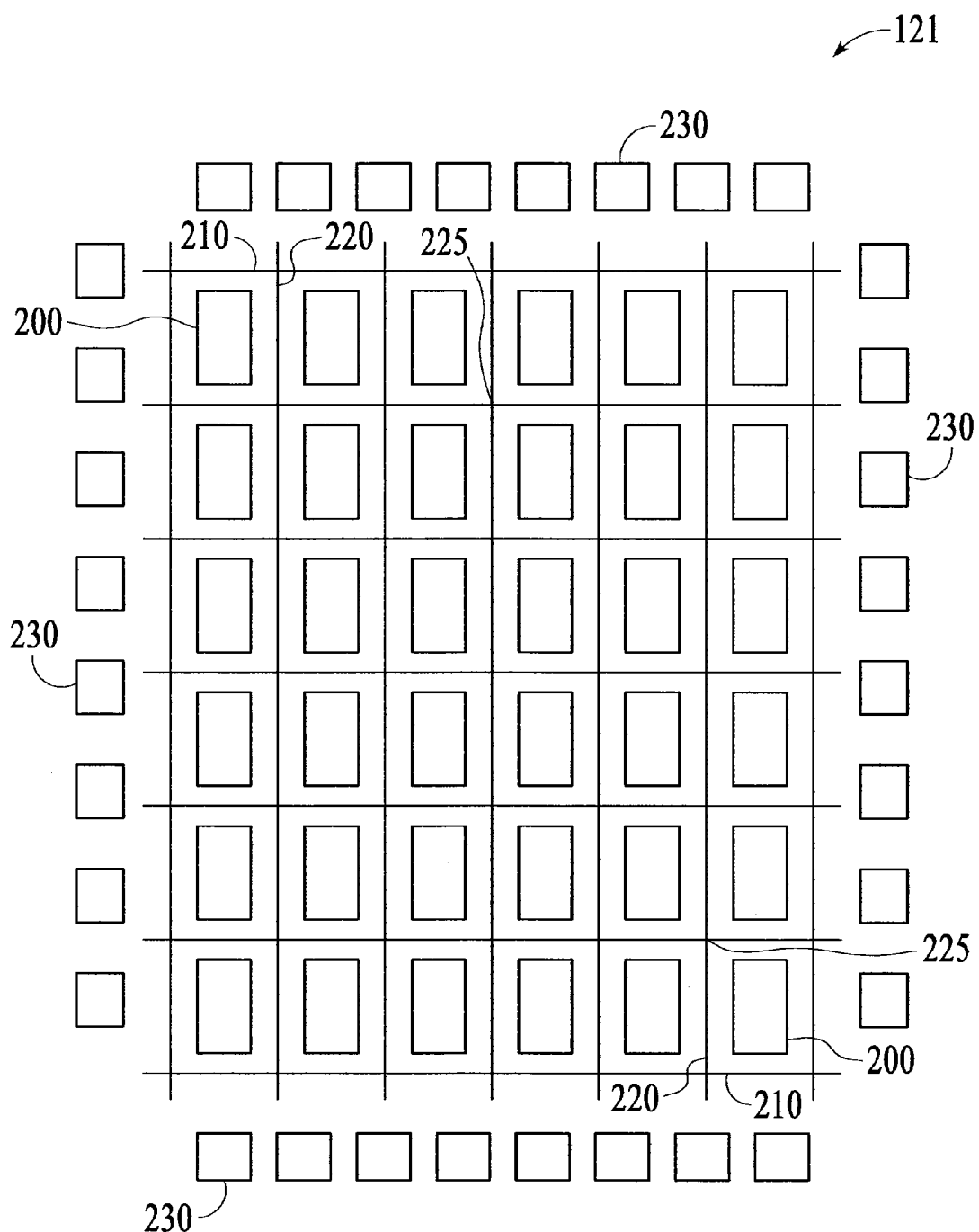
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
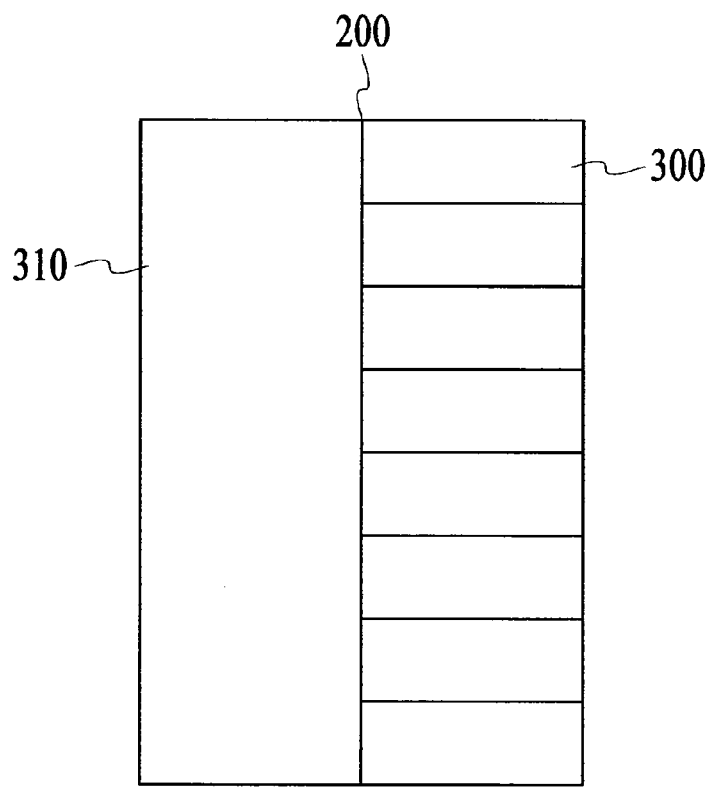
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
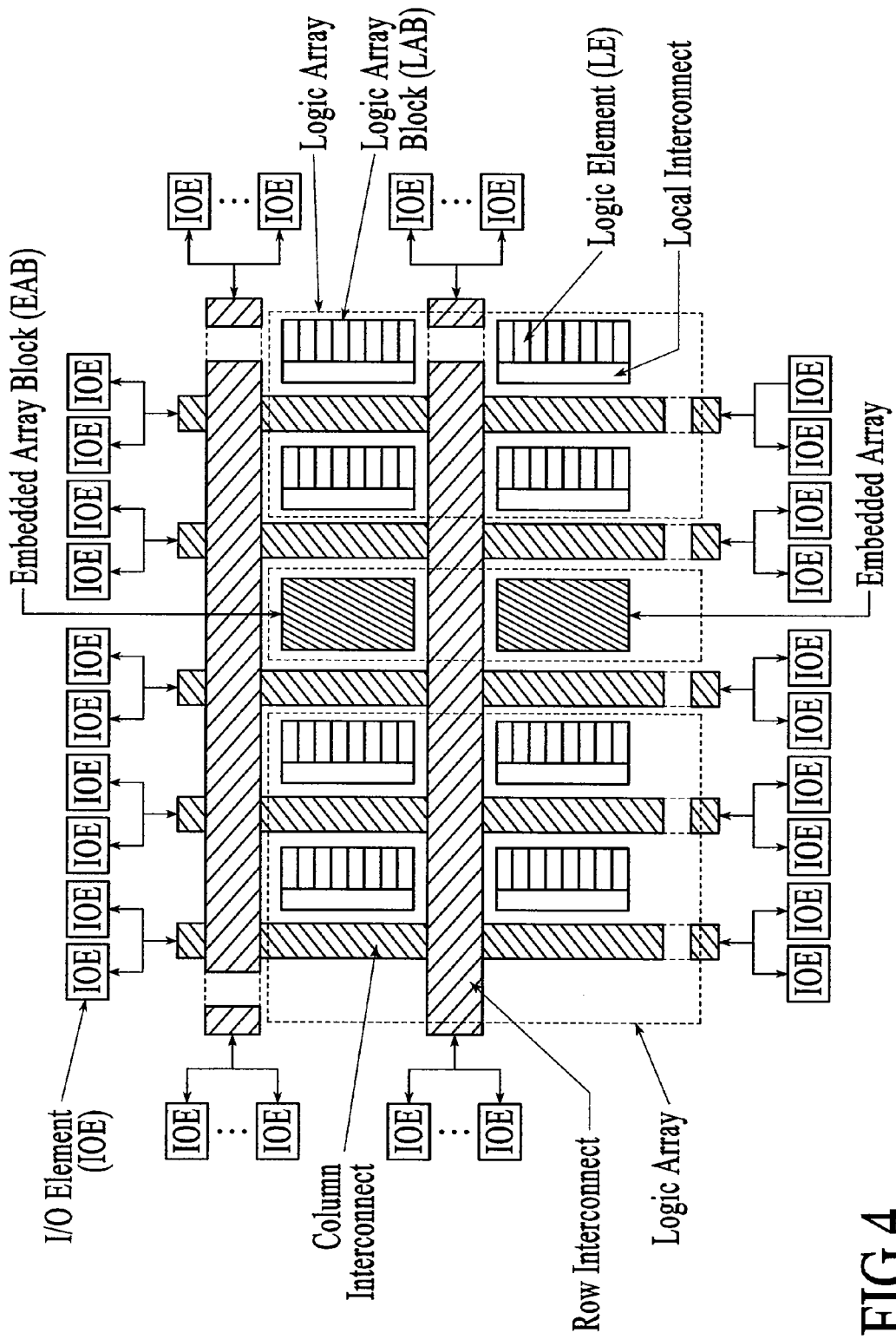
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX® family of products are described in detail in the their respective data sheets, available via the Internet at www.altera.com.

This invention boosts the embedded memory performance of programmable logic or other types of integrated circuits significantly by reducing or minimizing process, voltage, and temperature (PVT) dependence. Typical memory designs have fixed control signal timing and thus limiting the silicon performance over the PVT variation. This invention enables the compensation of real time PVT by adjusting the control signal timing dynamically and automatically. The invention includes a feedback system using a control block and a dummy mimicking concept, which are discussed in more detail below.

In particular, typical memory design has about 5 to 6 control signals to handle read and write operation to the memory. Depending on the design, there may be more or fewer control signals. Some examples of control signals include Sense Amp Enable/Disable (SAE), Pre-charge Enable/Disable, Word-Line Enable/Disable, Write Driver Enable/Disable and etc.

Typically, a design uses fixed amount of delay (i.e., single setting) to make sure all the internal control signals meet the required timing at all process, voltage, and temperature (PVT) conditions. This will lead a designer of the integrated circuit generally to allocate a relatively large timing margin for each control signal to compensate the PVT variation. For example, one corner of operation may be when the voltage is lowest (e.g., 1.75 volts) and temperature (i.e., 75 degrees centigrade) is the highest in the specification. And the process may be slower due to higher resistance and other parameters being at values leading to slower performance. The designer would use these time delays for operation of the control signal. Thus, the design would be tuned to operate and provide proper functionality under these worst case conditions.

Inserting extra timing margin to each of these control signals leads to severe performance degradation. This is especially important in programmable logic memory design, where the extra routing fabric that exists will further penalize the performance.

Specifically, when the device is used by a user, however, the voltage may be higher (e.g., 2.00 volts) and temperature may be lower (e.g., 35 degrees centigrade) than the worst case conditions that the device was designed for. Then, the time delays are reduced and it is possible to operate the control signals more quickly. For example, just by variations based on voltage and temperature, the performance may vary by 50 percent or more. However, because typically circuitry in the device does not adjust for the improved operating conditions, the device continues to operate the memory using the worst case conditions leading to poorer performance than is required.

Figure 5:
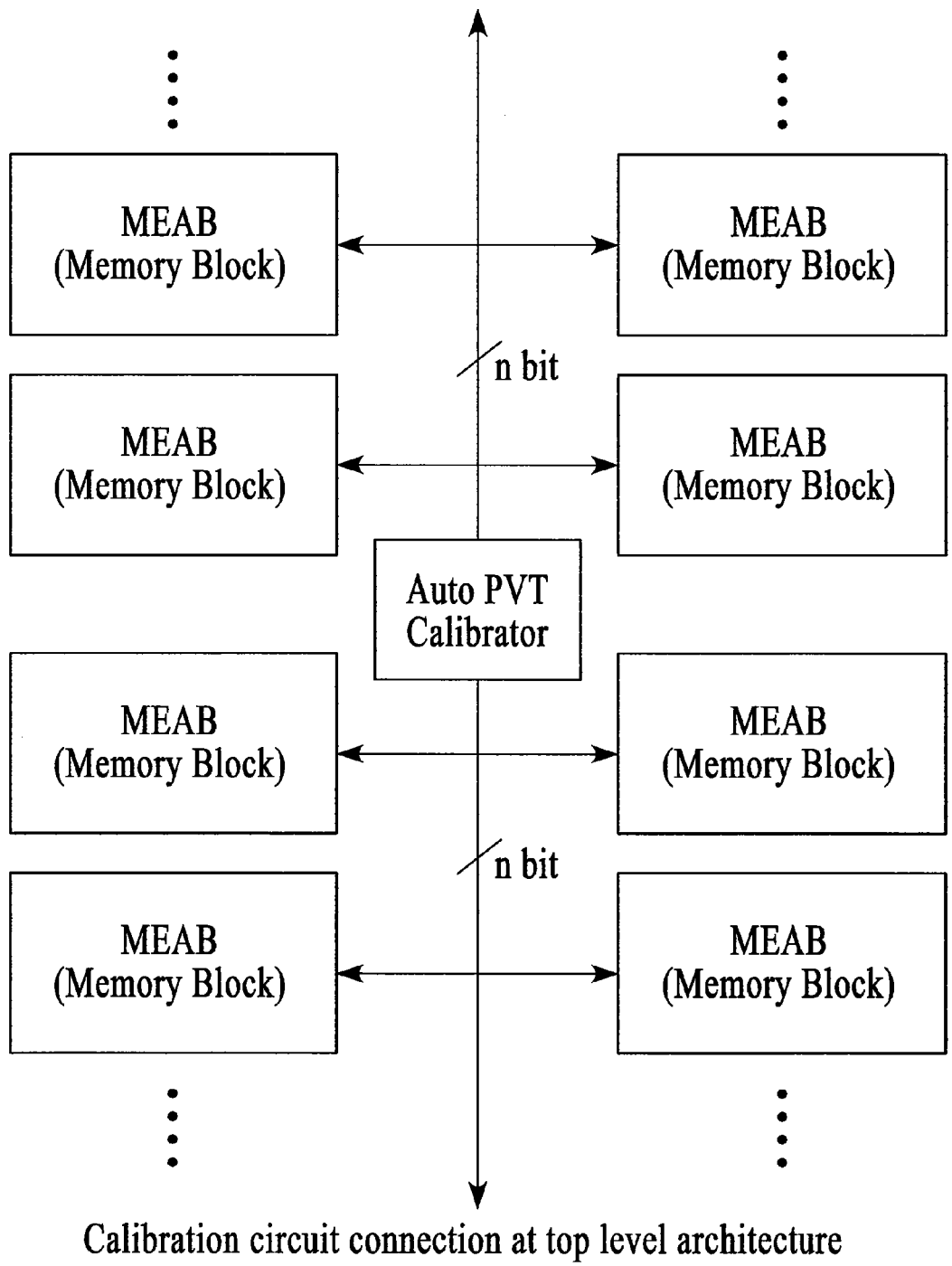
FIG. 5 shows a programmable logic integrated circuit having a number of memory enhanced array blocks (MEAB) connected to a calibration circuit to adjust control signal timing.

FIG. 5 shows a programmable logic integrated circuit having a number of memory blocks, referred to as MEAB in this diagram. An auto PVT calibrator circuit is connected to each of the memory blocks through an n-bit bus. This is merely an example of one implementation of the invention. There are many different variations while applying the same concepts. For example, the programmable logic integrated circuit may have any number of memory blocks, from one or more. The memory blocks may be organized in any arrangement in the programmable logic, as depicted in FIG. 5, columns, rows, or others. Each memory block may have 2048, 4096, or more bits of storage. The memory may be implemented as a RAM, CAM, FIFO, LIFO, or other.

In FIG. 5, there is one auto PVT calibrator connected to a number of memory blocks. This generally reduces the amount of extra circuitry needed to implement the invention in an integrated circuit. However, in other implementation, there may be more than one auto PVT calibrator block. For example, each memory block may have an assigned or associated auto PVT calibrator block. Further, the calibrator block may be part of or embedded within each memory block. In alternative implementations, there may be one calibrator block for a group of memory blocks. For example, there may be one column, row, or other group memory blocks, and one calibrator block will be assigned to this grouping. Another calibrator block will be assigned to another grouping, and so forth.

Figure 6:
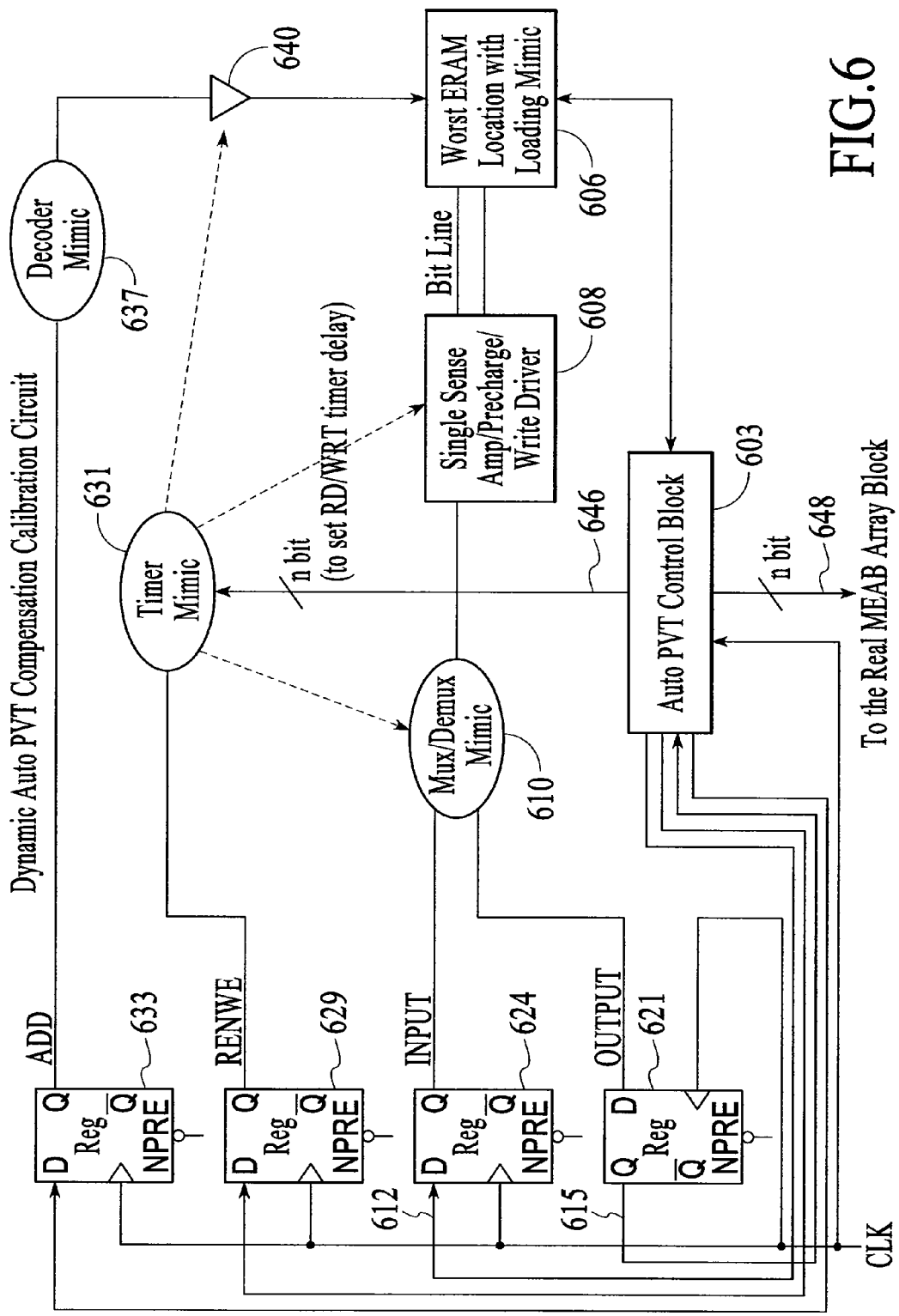
FIG. 6 shows a circuit diagram of a calibration circuit of the invention.

FIG. 6 shows a simplified circuit diagram of a calibration circuit of the invention. The PVT calibrator block of FIG. 5 may incorporate the circuitry of FIG. 6. Circuitry of the invention includes a calibration circuit, where a control block 603 is used to verify the feedback data from a memory mimicking path. The auto PVT control block may be a relatively simple implementation that does not require a significant amount of integrated circuit area. The control block is used to provide the memory with a fixed range of data patterns, and to verify the captured output data from the memory.

A mimicked memory 606 is connected to a sense amplifier block 608. This mimicked memory may be a worst-case RAM location with loading or a RAM representative of or associated with worst-case performance. For example, the mimicked RAM may be a separate RAM not used for normal RAM operation, but only calibration, and calibrated to give worst case results for tuning of the timing delays of the control signals. In other implementations, the mimicked RAM may be part of a normal RAM.

Sense amplifier block 608 is used to sense the RAM, and this block may also include precharge and write drive circuitry. In the implementation of the mimicked RAM path, there are both input and output data paths, connected to by a multiplexer-demultiplexer mimic block 610. Block 608 outputs or inputs data through block multiplexer-demultiplexer 610. Block 608 will be used to either read or sense the RAM contents and pass these to an output register 621. Or block 608 will be used to write data into the RAM from an input register 624. The registers in FIG. 6 are shown as D-type registers, but other type of logic, flip-flops, or registers may be used. The registers may be all the same type or circuit design, or each or some may be different than the others.

The control block also connects through a register 629 to a timer mimic 631. Timer mimic 631 controls the timing of the mimicked memory operation. The timer mimic is connected to the mux-demux mimic and sense amplifier block. The control block connects through a register 633 to a decoder mimic 637, which decodes the mimicked memory. In the decoder path, there is a decoder driver 640, that is also connected to the timer mimic. The control block further connects to the RAM. A clock signal CLK connects to each of the registers and to the control block.

The control block in the calibration circuit provides a data pattern into a mimic input path 612, and then verifies the output data content in the next clock via a mimic output path 615. If output data matches the expected data, control block would set the control timing setting in a delay chain (or circuit with similar functionality) to achieve higher frequency. This will continue until the mimicked memory fails to operate properly. For example, the data output received is not exactly the same as the data input stored. The setting prior to the fail cycle is the valid control signal timing setting with the highest performance achievable in that particular PVT.

The control block generates an n-bit calibration output signal 646 (and 648) that is provided to the timer mimic and also the MEAB memory array block. This calibration output signal sets the timer delay for the control signals which control operation of the memory. In other words, depending on what calibration output signal, the control signals will operate at particular frequency, and changing the calibration output signal changes this frequency. The n-bit calibration output signal is shown as separate lines 646 and 648, but may be the same signal line.

Figure 7:
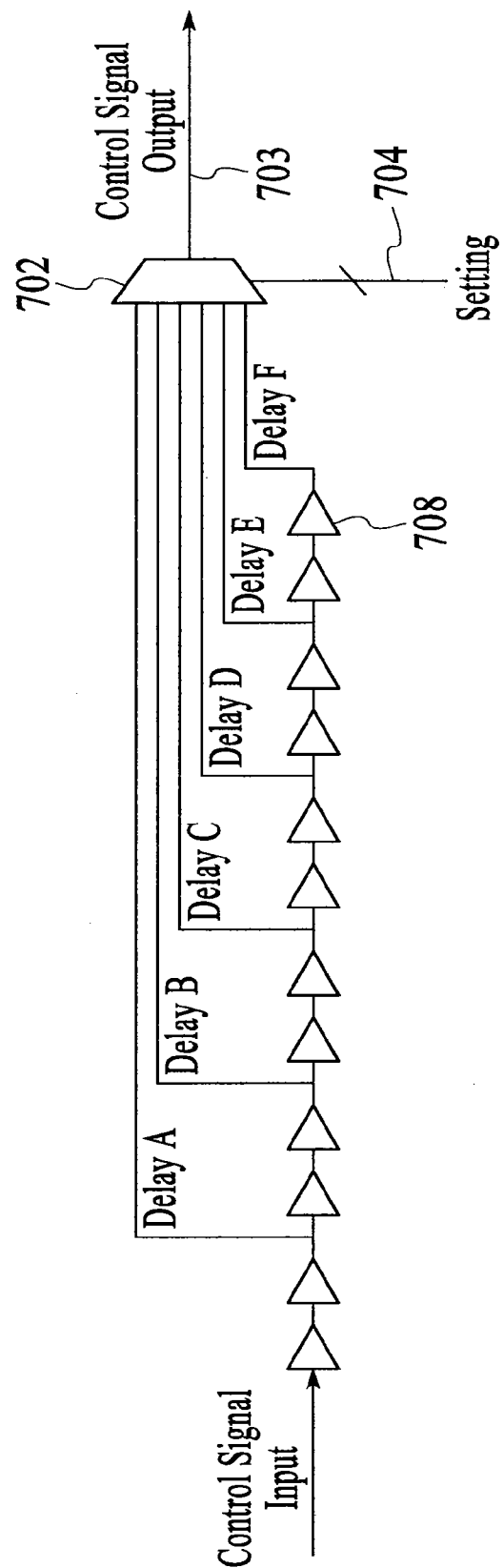
FIG. 7 shows an implementation of a timing delay circuit.

FIG. 7 shows an example of a timing delay circuit. Timer mimic circuit 631 may include this timing delay circuit, and also the memory may have a timer circuit (not shown) with this timing delay circuit. The timing delay circuit has a multiplexer 702 having a control signal output 703, setting selection input 704, and multiple control inputs, each have a different delay. The multiplexer circuit 702 may be implemented using pass gates, logic gates, or other circuit technique to provide this functionality.

For example, delay F is the longest delay path because a signal will travel through 12 delay elements 708. Delay A is the shortest delay path because there are only two delay elements. Each of the delay elements may be implemented using any circuitry to create a delay including inverters, gates, resistors, capacitors, and others.

The circuitry has six different delay settings, but in out implementations, there may be fewer than six settings, or more than six settings. For example, there may be 7, 8, 9, 10, 11, 12, or more settings. The selection input provided at 704 selects which input (e.g., delay A, B, C, and so forth) to output to output 703. When the selection input is N bits, there will be up to 2^N delay inputs.

The timing delay circuit of FIG. 7 receives calibration output signal 646 at multiplexer setting input 704. This will select the delay for control signals to the mimicked memory or the MEAB memory.

For a conventional memory design, a delay setting may be fixed after programming is done. This fixed setting applies to all process corners and usually an excessive delay margin is allocated to permit a device to operate under even worst-case PVT conditions. However, this invention idea allows the setting to be changed according to the PVT variation and thus eliminating the excessive delay margin.

For the invention, the calibration circuit will send a calibration setting into all memory blocks throughout the device at an interval cycle. This would not affect the normal operation of the FPGA memory block since the calibration circuit could work independently and change the setting in the interval clock cycle.

Memory blocks will be updated with the new calibrated setting at the next clock cycle after the data valid of calibration (calibration done). The output setting from calibration circuit will wait for the next clock cycle to be reflected in the memory.

Figure 8:
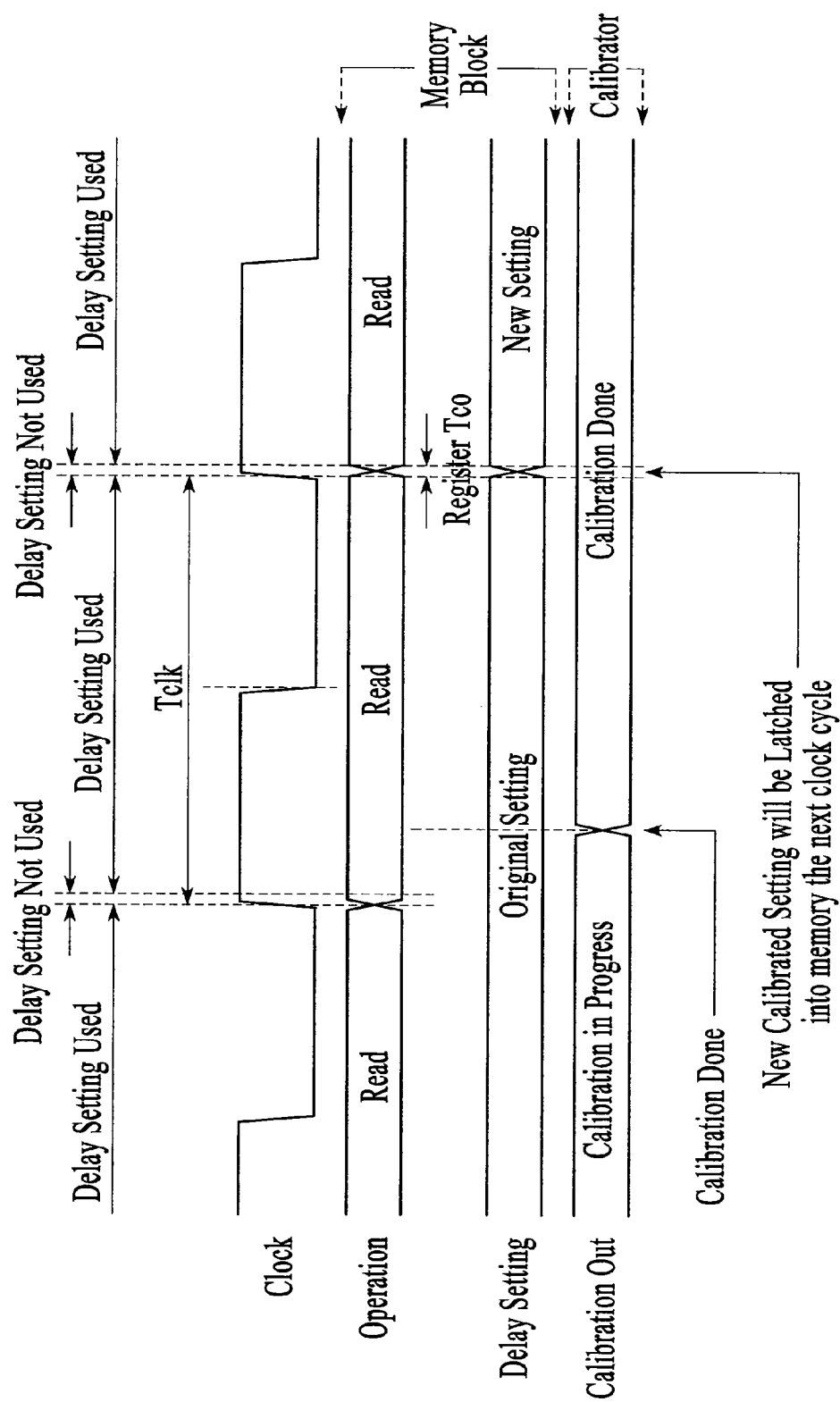
FIG. 8 provides a timing diagram of the calibration circuitry.

FIG. 8 provides a timing diagram of the calibration circuitry. The memory design will latch and decode the address or prepare the data to be written into RAM. This happens at every new clock cycle (i.e., positive clock edge). At this period (i.e., latching of data/address and so forth), the read and write operation is yet to begin. The delay chain setting will not be utilized at this period. To take advantage of this, a calibrated setting (i.e., signal 646) will update the delay chain at this period. Data, address, and the calibrated setting is clocked in at the same time using the same clock (see FIG. 8).

In an implementation of the invention, the calibration circuit will work continuously and track the temperature and voltage change in real time. There will be no significant power consumption. Power consumption for the calibration circuit is minimal since its operation is in full CMOS logic. The power consumption can be further reduced by powering down at certain time intervals. For example, see FIG. 9 showing a timing diagram of setting the calibration circuit on or off.

Only one calibration circuitry is needed for a device. The calibrated setting from this circuit would be used to set the control signal timing for all other repetitive memory blocks. Mimicking the memory path involves only one out of the total array paths. For example, only single bit line need to be mimicked compared to the total bit line width. As a result, die size for mimicking is negligible compared to the total memory block size exist in FPGA.

The invention may be applied to full memory path from input to output register or even just on certain timing critical path (e.g., memory core bit line).

At top level perspective, the calibration circuit is invisible to user. A memory block is calibrated to support the highest possible clock-to-output (TCO) frequency. Control timing is optimized regardless of PVT variation. Since the calibration circuit calibrates the delay setting with respect to the real time PVT, the operating condition range, voltage and temperature, is wider.

Below is a detailed example of an implementation of the invention for a full path implementation. This example involves the whole path from input to output register.

1. Upon power up, the default delay chain setting of all control signals will be set to say, [00000000]. Refer to FIG. 7. This setting will generate a set of control signals with a specific delay.

2. The control block pumps in one set of data (e.g., 0[Read]->1 [Read]->0 [Write]->1 [Write]) into the data register and the output will be fed back into the control block. Refer to table 1 provided in FIG. 12.

3. When the output data matches the expected data pattern, this will mean that the current delay chain is valid.

4. The control block will then change the delay setting to achieve higher Fmax (maximum memory operational frequency). Changing the delay setting for higher performance will tighten the control signal timing.

FIG. 10 shows an example of memory internal control signal timing for a read operation. As an example, referring to FIG. 10, the delay between signals (b1) and (e1), (e1) and (d1), and (d1) and (e1) is smaller. As a result, the final operation (e2) will complete earlier. This means that the (f) operation, the data out clocking could be done earlier by increasing the clock speed. The timing from the first operation (a) to the last operation (e2) determines the Fmax of the memory block.

5. Steps 2 and 3 will continue until the data fails to match the expected data due to failed setup/hold time of the internal control signal (e.g., sense amplifier enable, precharge, or other internal signals).

6. When this occurs, the control block will choose the setting prior to the failed ones to get the optimum delay setting for highest Fmax.

7. To add in more margin, the control block may have have additional input from a configuration RAM (CRAM) that determines which and how many delay chain setting prior to failed iteration will be selected. Refer to table 1 in FIG. 12.

Figure 11:
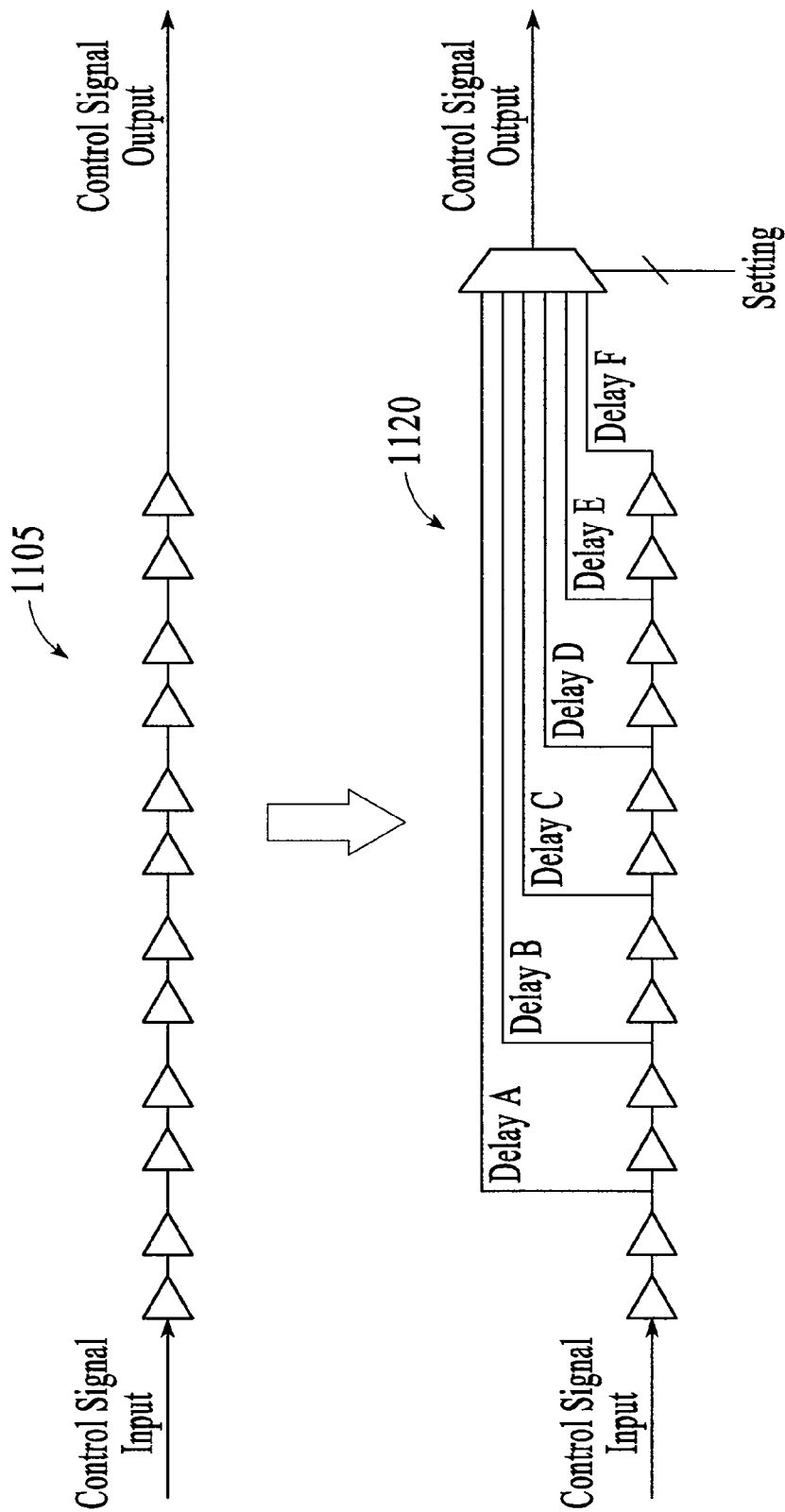
FIG. 11 shows a conventional control signal delay chain and a delay chain with a selectable control signal delay.

FIG. 11 shows a conventional control signal delay chain 1105 and a delay chain 1120 of the invention. The conventional delay chain does not have selectable delays as does delay chain 1120. The conventional delay has the same number of delay elements as the adjustable or selectable delay chain. The selectable delay chain has an additional multiplexer which taps into the delay chain at various points. More details of the operation of delay chain 1120 are discussed above in connection with FIG. 7.

FIG. 12 provides a table of the operation of a calibration circuit of the invention. A configuration RAM (CRAM) bit may be provided to provide additional flexibility to select 1 or more settings before a failure occurs. For setting 1, the control blocks writes a pattern into the memory in cycles, labeled 0 through 3, and reads the pattern out. If there is a pass, then setting 2 is used, and the control block writes and read the pattern in cycles, labeled 4 through 7. This continues with settings 3 and 4, cycles 8 through 15, until there is a failure. For example, once there is a failure using setting 4, the control circuitry uses setting 3 for operation of the memory. The number of setting is not limited 4 as shown in this figure. Also, the number of cycle per setting could vary depending on the data pattern to be checked. For more conservative setting, designer could set the memory to 2 or more setting prior to failure instead of 1. For example, if memory fails at setting 4, setting the memory to 2 would have more internal design margin then setting 3.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A programmable logic integrated circuit comprising:
a programmable interconnect structure;
a plurality of logic array blocks, configurable to implement user functions, coupled to the programmable interconnect structure;
a plurality of memory blocks, coupled to the programmable interconnect structure; and
a calibration circuit, coupled to the plurality of memory blocks to adjust a timing of control signals used read or write the memory blocks, wherein the calibration circuit employs circuitry capable of automatically adjusting timing of the control signals in response to process, voltage, or temperature variations associated with the programmable logic integrated circuit.

2. The programmable logic integrated circuit of claim 1 wherein the calibration circuit comprises:
a calibration memory block;
a read-write circuit block, coupled to the calibration memory block;
a multiplexer-demultiplexer block, coupled to the read-write circuit block;
a first input register, coupled to the multiplexer-demultiplexer block;
an output register, coupled to the multiplexer-demultiplexer block; and
a calibration control block, coupled to the calibration memory block, and the input and output registers.

3. The programmable logic integrated circuit of claim 2 wherein the calibration circuit comprises:
a second input register, coupled to the calibration control block; and
a timer block, coupled to the calibration control block and the second input register.

4. The programmable logic integrated circuit of claim 2 wherein the calibration circuit comprises:
a second input register, coupled to the calibration control block; and
a decoder block, coupled to the calibration control block and the calibration memory block.

5. The programmable logic integrated circuit of claim 4 wherein the timer block comprises a multiplexer circuit having a selection input coupled to the calibration control block.

6. The programmable logic integrated circuit of claim 4 wherein depending on a selection input, coupled the calibration control block, to a multiplexer circuit of timer block, timings of control signals associated with the multiplexer-demultiplexer block and read-write circuit block are adjusted.

7. The programmable logic integrated circuit of claim 4 wherein the timer block comprises:
a control signal input;
a first time delay circuit having an input coupled to the control signal input;
a second time delay circuit having an input coupled to an output of the first time delay circuit; and
a multiplexer having a timing selection input coupled to the calibration control circuit, a first multiplexer input coupled to the output of the first time delay circuit, and a second multiplexer input coupled to an output of the second time delay circuit.

8. The programmable logic integrated circuit of claim 1 wherein the calibration circuit is turned off in a standby mode.

9. An integrated circuit comprising:
a programmable logic circuit including a plurality of memory blocks;
a calibrator circuit coupled to the plurality of memory blocks through a bus, wherein the calibration circuit comprises a first circuitry capable of mimicking operational variations of at least one of the memory blocks due to variations in the at least one memory block manufacturing, or voltage, or temperature; and
a timing adjustment circuit capable of varying timing of memory control signals in response to timing adjustment signals, wherein the timing adjustment signal are generated by the first circuitry responding to the operational variations of the at least one memory block.

10. The integrated circuit of claim 9, wherein the first circuitry comprises dummy memory circuitry capable of mimicking the operational variation of the at least one memory block due to variations in manufacturing, or voltage, or temperature associated with the at least one memory block.

11. The integrated circuit of claim 9, wherein the timing adjustment signals are part of a feedback loop employed to adjust the timing of the memory control signals in response to variations in manufacturing, or voltage, or temperature associated with the plurality of memory blocks.

12. The integrated circuit of claim 9, wherein the calibration circuit is capable of detecting and correcting for the operational variations of at least one of the plurality of memory blocks associated with timing variations of the memory control signals.

* * * * *